(12) United States Patent
Hwang et al.

(10) Patent No.: US 12,224,191 B2
(45) Date of Patent: Feb. 11, 2025

(54) WAFER TRANSFER APPARATUS WITH ALIGNER

(71) Applicant: SAMSUNG ELECTRONICS CO., LTD., Suwon-si (KR)

(72) Inventors: Beomsoo Hwang, Suwon-si (KR); Kongwoo Lee, Suwon-si (KR); Myungki Song, Suwon-si (KR); Kyusang Lee, Suwon-si (KR); Seojoo Choi, Suwon-si (KR); Jinhyuk Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 7 days.

(21) Appl. No.: 18/117,259

(22) Filed: Mar. 3, 2023

(65) Prior Publication Data

US 2024/0021452 A1 Jan. 18, 2024

(30) Foreign Application Priority Data

Jul. 12, 2022 (KR) ........................ 10-2022-0085622

(51) Int. Cl.
*H01L 21/67* (2006.01)
*B65G 47/90* (2006.01)
*H01L 21/687* (2006.01)

(52) U.S. Cl.
CPC ...... *H01L 21/67259* (2013.01); *B65G 47/905* (2013.01); *B65G 47/907* (2013.01); *H01L 21/67201* (2013.01); *H01L 21/68707* (2013.01)

(58) Field of Classification Search
CPC ......... H01L 21/67259; H01L 21/67201; H01L 21/68707; H01L 21/68; H01L 21/681; B65G 47/905
See application file for complete search history.

(56) References Cited

U.S. PATENT DOCUMENTS 6,075,334 A * 6/2000 Sagues ............. H01L 21/67766
414/416.03
2003/0202092 A1 10/2003 Sadighi et al.
2015/0370246 A1 12/2015 Yuk et al.
2016/0055425 A1 2/2016 Minam
(Continued)

FOREIGN PATENT DOCUMENTS

JP 2009-49250 A 3/2009
KR 10-2005-0105517 A 11/2005
KR 10-2006-0126627 A 12/2006
(Continued)

*Primary Examiner* — Gerald McClain
(74) *Attorney, Agent, or Firm* — Sughrue Mion, PLLC

(57) ABSTRACT

A wafer transfer apparatus includes a controller, a wafer transfer robot including a hand unit configured to hold a wafer, a driving unit connected to the hand unit and configured to move the wafer, and a sensor unit provided on the driving unit, and a plurality of transfer structures configured to exchange the wafer with the wafer transfer robot, each of the plurality of transfer structures including a plurality of markers recognizable by the sensor unit, where the sensor unit includes a camera sensor recognizing the plurality of markers and a laser sensor configured to measure distances to the plurality of markers by emitting a laser to the plurality of markers and receiving the laser reflected from the plurality of markers.

19 Claims, 12 Drawing Sheets

(56) References Cited

U.S. PATENT DOCUMENTS

2017/0173796 A1* 6/2017 Kim ...................... B25J 9/1612
2021/0043481 A1 2/2021 Lee et al.

FOREIGN PATENT DOCUMENTS

| KR | 10-1565336 B1 | 11/2015 |
| KR | 10-2015-0146095 A | 12/2015 |
| KR | 10-2019-0139537 A | 12/2019 |
| KR | 10-2020-0034607 A | 3/2020 |
| KR | 10-2156896 B1 | 9/2020 |
| KR | 10-2230866 B1 | 3/2021 |

* cited by examiner

WAFER TRANSFER APPARATUS WITH ALIGNER

CROSS-REFERENCE TO RELATED APPLICATION(S)

This application is based on and claims priority to Korean Patent Application No. 10-2022-0085622 filed on Jul. 12, 2022 in the Korean Intellectual Property Office, the disclosure of which is incorporated herein by reference in its entirety.

BACKGROUND

Example embodiments present disclosure relate to a wafer transfer apparatus and a semiconductor processing system including the same.

A processing system for performing a semiconductor process may include a wafer transfer robot for transferring a wafer, and the wafer transfer robot may transfer the wafer between various transfer structures for transferring and/or storing the wafer and a processing chamber. The wafer transfer robot may automatically move the wafer in order to proceed with the semiconductor process, but it is necessary to perform a teaching operation for defining positions of the transfer structures and a position of the wafer transfer robot, before starting the semiconductor process or in every predetermined period. The teaching operation may be performed manually or by using a separate teaching station. Accordingly, there are problems such as the occurrence of deviation depending on a degree of skill of an operator, an increase in manufacturing costs of a wafer transfer apparatus due to the separate teaching station.

For example, a wafer transfer robot may be a device that moves a wafer between a front opening unified pod (FOUP) and an aligner, a buffer, and a load-lock chamber. Before the wafer transfer robot moves the wafer, a teaching operation that specifies positions of the wafer transfer robot, the FOUP, the aligner, the buffer, and the load-lock chamber may be performed. The teaching operation may typically be performed manually. Therefore, depending on a degree of skill of an operator, there may be problems such as a time taken for the teaching operation being changed, accuracy of the teaching operation deteriorated, etc.

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public.

SUMMARY

Provided is wafer transfer apparatus that may automatically execute a teaching operation to specify positions of a wafer transfer robot, a front opening unified pod (FOUP), a buffer, and an aligner, and a semiconductor processing system including the same.

Additional aspects will be set forth in part in the description which follows and, in part, will be apparent from the description, or may be learned by practice of the presented embodiments.

According to an aspect of an example embodiment, a wafer transfer apparatus may include a controller, a wafer transfer robot including a hand unit configured to hold a wafer, a driving unit connected to the hand unit and configured to move the wafer, and a sensor unit provided on the driving unit, and a plurality of transfer structures configured to exchange the wafer with the wafer transfer robot, each of the plurality of transfer structures including a plurality of markers recognizable by the sensor unit, where the sensor unit may include a camera sensor recognizing the plurality of markers and a laser sensor configured to measure distances to the plurality of markers by emitting a laser to the plurality of markers and receiving the laser reflected from the plurality of markers, and the controller may be configured to acquire position information about the plurality of transfer structures with respect to the wafer transfer robot, based on positions of the plurality of markers recognized by the sensor unit and the distances to the plurality of markers measured by the sensor unit, and control the wafer transfer robot based on the position information.

According to an aspect of an example embodiment, a semiconductor processing system may include at least one processing chamber configured to perform a semiconductor process for a wafer, a wafer transfer apparatus including a first wafer transfer robot configured to transfer the wafer by a FOUP, and a load-lock chamber configured to transfer the wafer between the at least one processing chamber and the wafer transfer apparatus, where the wafer transfer apparatus may include a body on which the FOUP is provided and an aligner provided on the body and in which the wafer is accommodated, and the wafer transfer apparatus may be configured to obtain, with a first sensor unit provided on the first wafer transfer robot, position information about the body, the FOUP, the aligner, and a wafer inlet by recognizing a plurality of markers provided on the body, the FOUP, the aligner, and the wafer inlet, and transfer the wafer based on the position information.

According to an aspect of an example embodiment, a wafer transfer apparatus may include a plurality of transfer structures including a plurality of first markers and configured to provide a space in which a wafer is stored, a body on which the plurality of transfer structures are provided, the body including a plurality of reference markers different from the plurality of first markers, a wafer transfer robot configured to transfer the wafer between the plurality of transfer structures and including a sensor unit configured to recognize the plurality of first markers and the plurality of reference markers, and a controller provided in the body and configured to execute a teaching operation of the wafer transfer robot, where, in the teaching operation, the controller is configured to determine, with the sensor unit, a reference position and a relative position of the wafer transfer robot with respect to the body by acquiring coordinate information for each of the plurality of reference markers, and determine, with the sensor unit, position information including a position and an attitude of the wafer transfer robot for each of the plurality of transfer structures by acquiring coordinate information for each of the plurality of first markers.

BRIEF DESCRIPTION OF DRAWINGS

The above and other aspects, features, and advantages of certain example embodiments of the present disclosure will be more apparent from the following description taken in conjunction with the accompanying drawings, in which.

DETAILED DESCRIPTION

Figure 1:
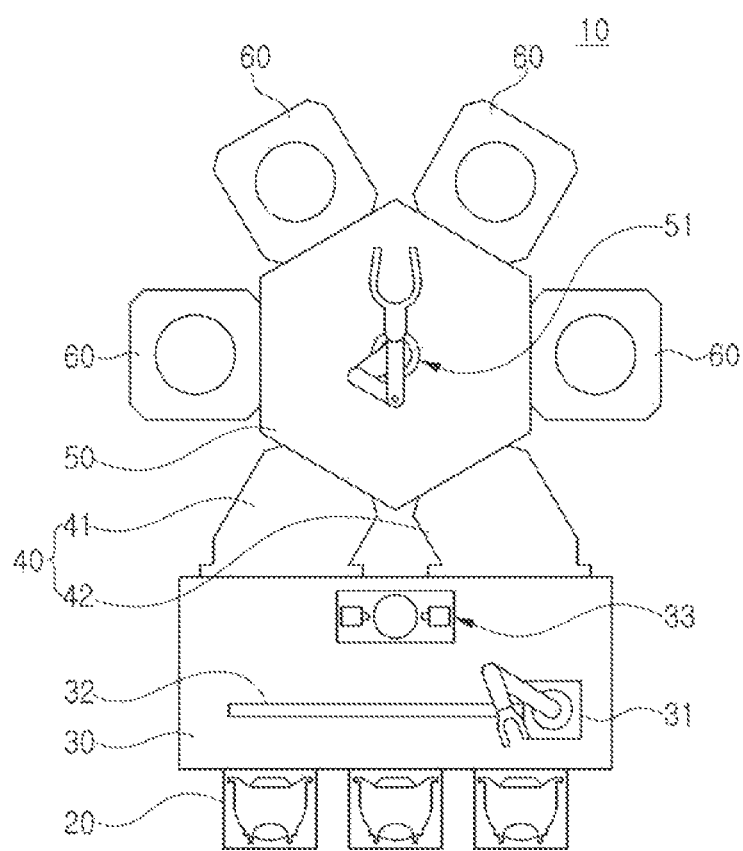
FIG. 1 is a diagram illustrating a semiconductor processing system according to an example embodiment of the present disclosure.

Hereinafter, example embodiments of the disclosure will be described in detail with reference to the accompanying drawings. The same reference numerals are used for the same components in the drawings, and redundant descriptions thereof will be omitted. The embodiments described herein are example embodiments, and thus, the disclosure is not limited thereto and may be realized in various other forms.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

FIG. 1 is a diagram illustrating a semiconductor processing system according to an example embodiment of the present disclosure.

Referring to FIG. 1, a semiconductor processing system 10 according to an example embodiment of the present disclosure may include a wafer transfer apparatus 30, a load-lock chamber 40, a transfer chamber 50, and a plurality of processing chambers 60. For example, the wafer transfer apparatus 30 may receive a wafer through a container such as a front opening unified pod (FOUP) 20 on a line on which the semiconductor processing system 10 is disposed. The wafer transfer apparatus 30 may transfer the wafer, received through the FOUP 20, to the load-lock chamber 40, or may receive the wafer on which a semiconductor process is completed in the processing chambers 60 from the load-lock chamber 40, and may accommodate the same in the FOUP 20.

The wafer transfer apparatus 30 may include a wafer transfer robot 31 having an arm holding the wafer, a rail unit 32 moving the wafer transfer robot 31, and an aligner 33 aligning the wafer. In an operation of transferring the wafer from the FOUP 20 to the load-lock chamber 40, the wafer transfer robot 31 may remove the wafer accommodated in the FOUP 20, and may dispose the same on the aligner 33. The aligner 33 may rotate the wafer to align the wafer in one predetermined direction. When the aligner 33 completes the alignment of the wafer, the wafer transfer robot 31 may remove the wafer from the aligner 33, and move the same to the load-lock chamber 40.

The load-lock chamber 40 may include a loading chamber 41 connected to the wafer transfer apparatus 30 and in which wafers fed into the processing chamber 60 temporarily remain for executing a semiconductor processing, and an unloading chamber 42 in which wafers ejected from the processing chamber 60 temporarily remain after completing the process. When a wafer aligned in the aligner 33 is loaded into the loading chamber 41, an internal space of the loading chamber 41 may be decompressed to prevent entering of an external contaminant.

The load-lock chamber 40 may be connected to the transfer chamber 50, and the plurality of processing chambers 60 may be connected around the transfer chamber 50. A wafer transfer robot 51 for transferring the wafer between the load-lock chamber 40 and the plurality of processing chambers 60 may be disposed in the transfer chamber 50. The wafer transfer robot 31 of the wafer transfer apparatus 30 may be referred to as a first wafer transfer robot, and the wafer transfer robot 51 of the transfer chamber 50 may be referred to as a second wafer transfer robot.

Each of the plurality of processing chambers 60 may perform a semiconductor process on the wafer. For example, the semiconductor process performed by the plurality of processing chambers 60 may include a deposition process, an etching process, an exposure process, an annealing process, a polishing process, an ion implantation process, etc.

In the semiconductor processing system 10, the wafer transferred through the FOUP 20 may be moved to the load-lock chamber 40, and the wafer may be put into at least one of the plurality of processing chambers 60, to perform the semiconductor process. After the semiconductor process is completed, a transfer operation of accommodating an ejected wafer back to the FOUP 20 may be performed automatically. To automatically perform the transfer operation as described above, the first wafer transfer robot 31 of the wafer transfer apparatus 30 and the second wafer transfer robot 51 of the transfer chamber 50 may be necessary to know an exact position of each of the transfer structures, which may be a target transfer structure to which the wafer is transferred. For example, in the wafer transfer apparatus 30, the transfer structures may include a FOUP 20, an aligner 33, and a wafer entrance/exit of a load-lock chamber 40. In the transfer chamber 50, the transfer structures may include a load-lock chamber 40, and wafer entrance/exits of a plurality of processing chambers 60.

For example, an operation of teaching correcting positions of the first and second wafer transfer robots 31 and 51 and positions of the transfer structures may be performed periodically, prior to or during the semiconductor process. In an example embodiment of the present disclosure, a sensor unit may be respectively mounted on the first and second wafer transfer robots 31 and 51, and a plurality of markers may be attached to each of the transfer structures.

In the teaching operation, the sensor units of the first and second wafer transfer robots 31 and 51 may recognize a plurality of markers attached to one of the transfer structures, and may measure distances to the plurality of markers. The controller of the semiconductor processing system 10 may generate position information about the transfer structures, based on positions of the plurality of markers recognized by the sensor unit and the distances to the plurality of markers, and may control an operation of the wafer transfer robot based thereon. Therefore, since the teaching operation does not require a manual work, the teaching operation may be completed with a constant quality regardless of a degree of skill of an operator. In addition, since there may be no need for additional equipment such as a teaching station, the semiconductor processing system 10 of automatically completing a teaching operation may be implemented without additional costs incurred by providing the teaching station.

Figure 2:
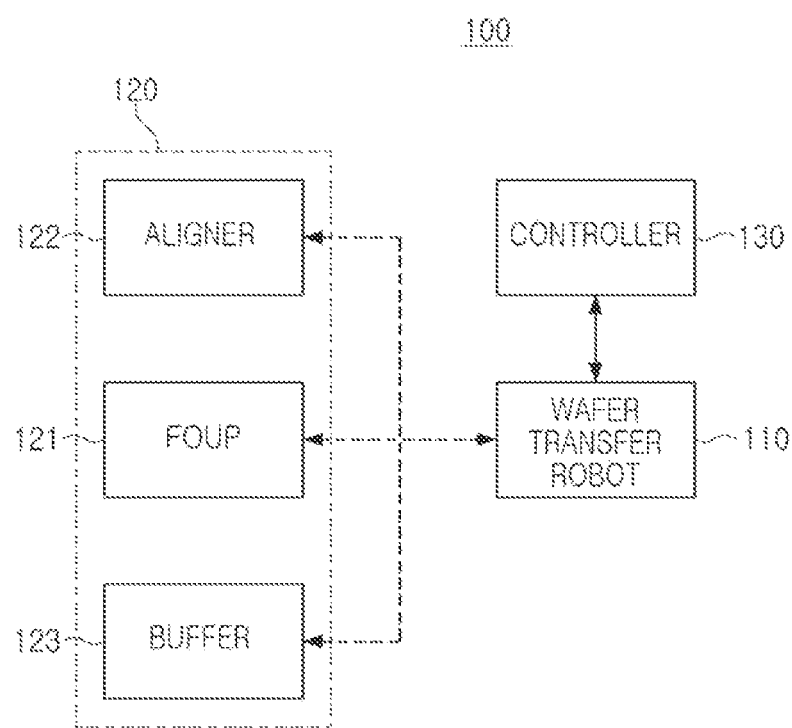
FIG. 2 is a diagram illustrating a wafer transfer apparatus according to an example embodiment of the present disclosure.

FIG. 2 is a diagram illustrating a wafer transfer apparatus according to an example embodiment of the present disclosure.

Referring to FIG. 2, a wafer transfer apparatus 100 according to an example embodiment of the present disclosure may include a wafer transfer robot 110, a plurality of transfer structures 120, and a controller 130. The wafer transfer robot 110 may move a wafer between the plurality of transfer structures 120, and the controller 130 may control movement of the wafer transfer robot 110.

In the example embodiment illustrated in FIG. 2, the wafer transfer apparatus 100 may be connected to the FOUP 20, and may be equipment that transfers the wafer to the load-lock chamber 40 or receives the wafer from the load-lock chamber 40, as described above with reference to FIG. 1. Therefore, the plurality of transfer structures 120 may include a FOUP 121, and an aligner 122. According to an example embodiment, the plurality of transfer structures 120 may further include a buffer 123. After a semiconductor process is completed, when a predetermined waiting time is required before moving a wafer back to the FOUP 121, the buffer 123 may be a structure for temporarily storing the wafer.

The controller 130 may control an operation of the wafer transfer robot 110. For example, the controller 130 may control movement, position movement, etc. of the wafer transfer robot 110 such that the wafer transfer robot 110 transfers a wafer between the plurality of transfer structures 120. In addition, the controller 130 may perform an operation of teaching adjusting position information about the plurality of transfer structures 120 such that the wafer transfer robot 110 accurately feeds and ejects the wafer with respect to each of the plurality of transfer structures 120.

For example, a plurality of markers may be respectively attached to the plurality of transfer structures 120, and a sensor unit capable of recognizing the plurality of markers may be mounted on the wafer transfer robot 110. The controller 130 may move the wafer transfer robot 110 to recognize each of the plurality of markers with the sensor unit. For example, the controller 130 may recognize the plurality of markers respectively attached to the plurality of transfer structures 120 through a sensor unit mounted on the wafer transfer robot 110.

Each of the plurality of markers may be a marker implemented on a two-dimensional plane, and may include a QR code, an ArUco marker, or a figure of a specific shape. The sensor unit may include a camera sensor capable of generating an image on which the marker is displayed, to recognize the marker, and a laser sensor capable of measuring a distance to the marker.

When the teaching operation starts, the controller 130 may acquire an image on which the marker is displayed using the camera sensor, and may adjust position and attitude of the wafer transfer robot 110 such that the marker is displayed in a central portion of the image. When the image on which the marker is displayed in the central portion is generated, the controller 130 may recognize position of the marker, and may measure a distance to the marker using the laser sensor.

For example, the plurality of markers attached to each of the plurality of transfer structures 120 may be located on one plane defined in a three-dimensional space. The controller 130 may store dimension information about each of the plurality of markers in advance. The controller 130 may combine the position of the marker and the distance to the marker with the dimension information, to acquire position information indicating a position of each of the plurality of transfer structures 120 with respect to the wafer transfer robot 110. The controller 130 may automatically acquire position information in the teaching operation as described above, and may control movement of the wafer transfer robot 110 in a process performed after the teaching operation based on the position information.

Figure 3:
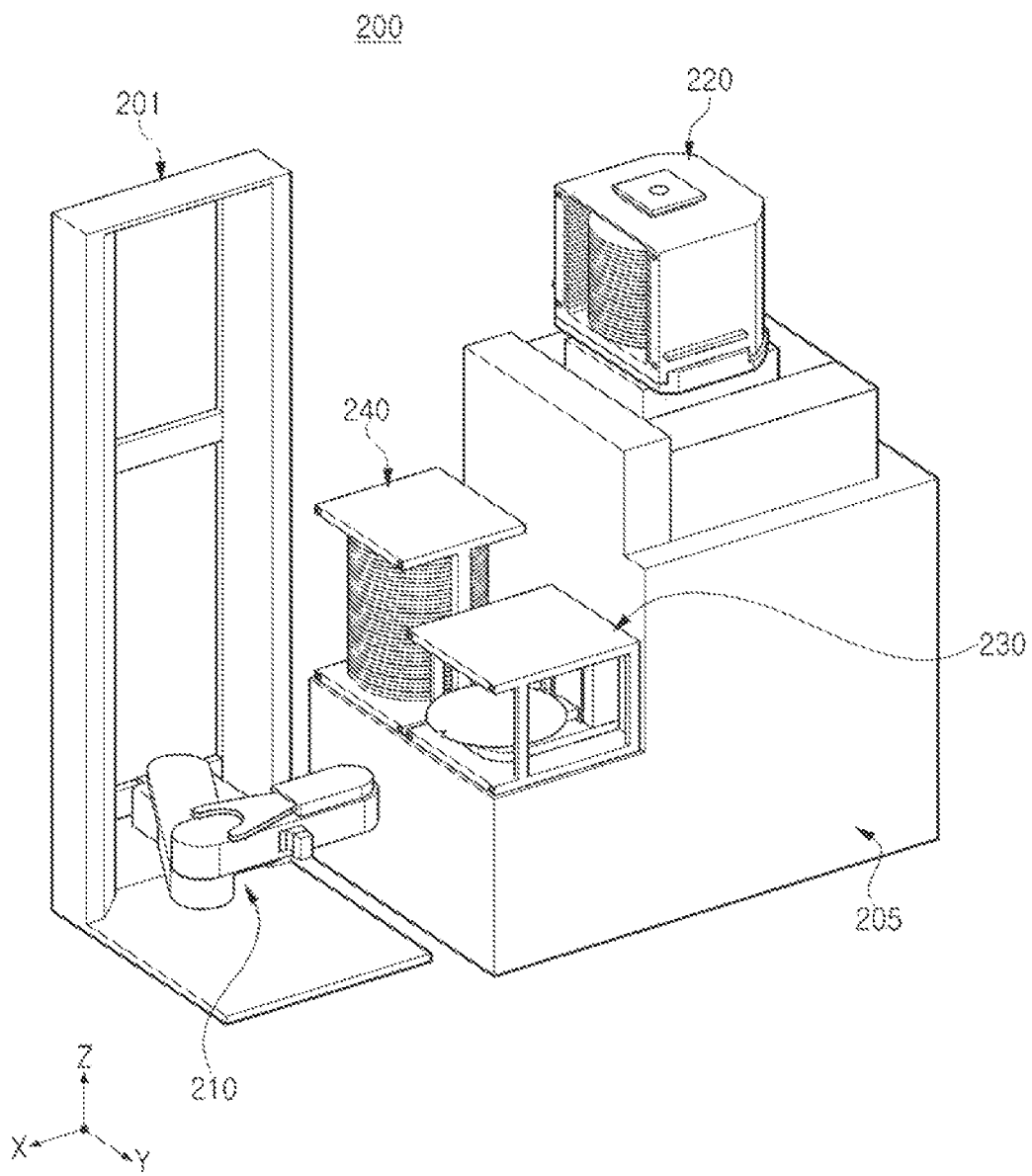
FIG. 3 is a diagram illustrating a wafer transfer apparatus according to an example embodiment of the present disclosure.

FIG. 3 is a diagram illustrating a wafer transfer apparatus according to an example embodiment of the present disclosure.

Referring to FIG. 3, a wafer transfer apparatus 200 according to an example embodiment of the present disclosure may be an equipment front end module (EFEM) feeding a wafer, in which a semiconductor process is performed, into a load-lock chamber, and ejecting the wafer, in which the semiconductor process is completed, from the load-lock chamber. As illustrated in FIG. 3, the wafer transfer apparatus 200 may include a wafer transfer robot 210, a FOUP 220, an aligner 230, and a buffer 240. A structure of the wafer transfer apparatus 200 is not limited as illustrated in FIG. 3, and may be variously modified according to example embodiments.

The wafer transfer robot 210 may be mounted on a robot frame 201 to move and transfer a wafer. In the example embodiment illustrated in FIG. 3, the wafer transfer robot 210 may move along a rail mounted on the robot frame 201 in a vertical direction (a Z-axis direction), but a direction in which the wafer transfer robot 210 moves may be changed according to a shape of the robot frame 201.

Transfer structures (e.g., the FOUP 220, the aligner 230, and the buffer 240) may be mounted on a body 205. According to an example embodiment, a controller may be mounted in an internal space of the body 205, and the controller may control the wafer transfer robot 210, the FOUP 220, the aligner 230, and the buffer 240. For example, the controller may control the wafer transfer robot 210 to move the wafer, and may execute an operation of teaching adjusting position information about the FOUP 220, the aligner 230, or the buffer 240 with respect to the wafer transfer robot 210. Also, the controller may rotate the wafer disposed on the aligner 230 on a plane, parallel to an X-axis direction and a Y-axis direction, to align the wafer in a predetermined direction.

The FOUP 220 may be a container in which a front surface may be open and a plurality of wafers may be accommodated, and may be transferred to the wafer transfer apparatus 200 by moving along a rail installed on a line. After arriving at the wafer transfer apparatus 200, when the front surface of the FOUP 220 is opened to expose the wafers accommodated therein, the wafer transfer robot 210 may eject the wafer, and may move the same to the aligner 230. When a direction thereof is aligned in the aligner 230, the wafer transfer robot 210 may eject the wafer, and may feed the wafer into the load-lock chamber connected to a processing chamber.

When the wafer for which the semiconductor process is completed is ejected from the processing chamber toward the load-lock chamber, the wafer transfer robot 210 may lead the wafer out from the load-lock chamber, and may accommodate the wafer into the buffer 240 or the FOUP 220 according to a type of semiconductor process. For example, when the wafer is ejected from the processing chamber in which an etching process, requiring a predetermined waiting time after the semiconductor process is completed, is performed, the wafer transfer robot 210 may accommodate the wafer in the buffer 240 first, and may then transfer the same to the FOUP 220.

Figure 4:
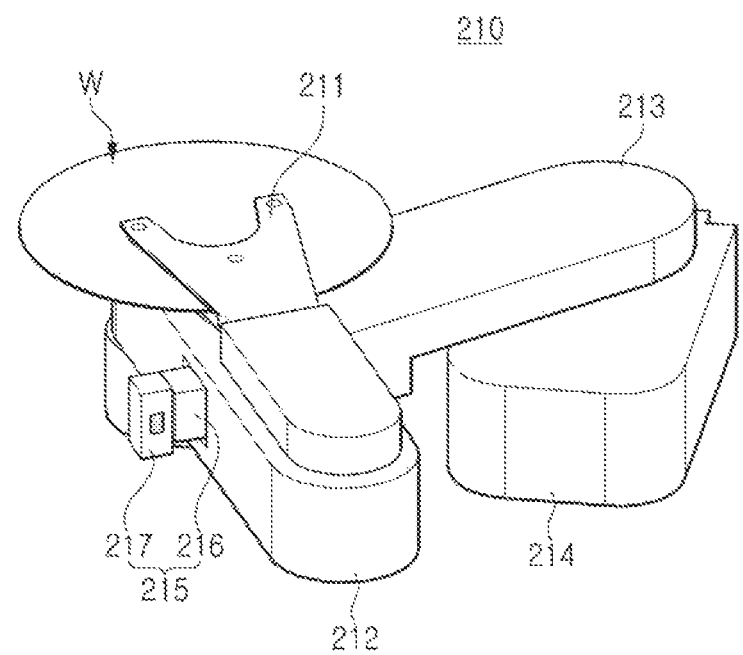
FIG. 4 is a diagram illustrating a wafer transfer robot according to an example embodiment of the present disclosure.

FIG. 4 is a diagram illustrating a wafer transfer robot according to an example embodiment of the present disclosure.

FIG. 4 illustrates a wafer transfer robot 210 mounted in the wafer transfer apparatus 200, as described with reference to FIG. 3 above. Referring to FIG. 4, the wafer transfer robot 210 may include a hand unit 211 for holding a wafer W, a driving unit (e.g., 212 to 214) connected to the hand unit 211 to move the wafer W, and a sensor unit 215 mounted on the driving unit (e.g., 212 to 214.

The hand unit 211 may include at least two fingers, and a vacuum suction port for fixing the wafer W may be formed in the fingers. For example, one wafer transfer robot 210 may include a plurality of hand units 211 adjacent to each other in a vertical direction. In this case, a transfer operation for the wafer W, such as a wafer W to be fed to one of transfer structures, may be carried out at the same time.

The driving unit (e.g., 212 to 214) may include link arm units 212 and 213 and a base unit 214. A first link arm unit 212 may be directly connected to the hand unit 211, and a second link arm unit 213 may be connected between the base unit 214 and the first link arm unit 212. In the example embodiment illustrated in FIG. 4, although the wafer transfer robot 210 is illustrated to form a SCARA robot, the wafer transfer robot 210 may be implemented in various forms such as an orthogonal robot, an articulated robot, etc.

The sensor unit 215 may be mounted on the driving unit (e.g., 212 to 214), and the sensor unit 215 may include a camera sensor 216 and a laser sensor 217. For example, the sensor unit 215 may recognize a marker attached to a transfer structure to which the wafer transfer robot 210 transfers the wafer W, and may measure a distance to the marker. The sensor unit 215 may recognize the marker, and information such as a distance measured with respect to the marker may be used to generate position information about the transfer structure. Since the position information about the transfer structure has to be most accurately adjusted with respect to the hand unit 211 holding the wafer W among components of the wafer transfer robot 210, the sensor unit 215 may be attached to a nearby location as close to the hand unit 211 as possible. In the example embodiment illustrated in FIG. 4, the sensor unit 215 may be mounted on the first link arm unit 212 directly connected to the hand unit 211.

FIGS. 5, 6, 7 and 8 are diagrams illustrating transfer structures according to an example embodiment of the present disclosure.

Figure 5:
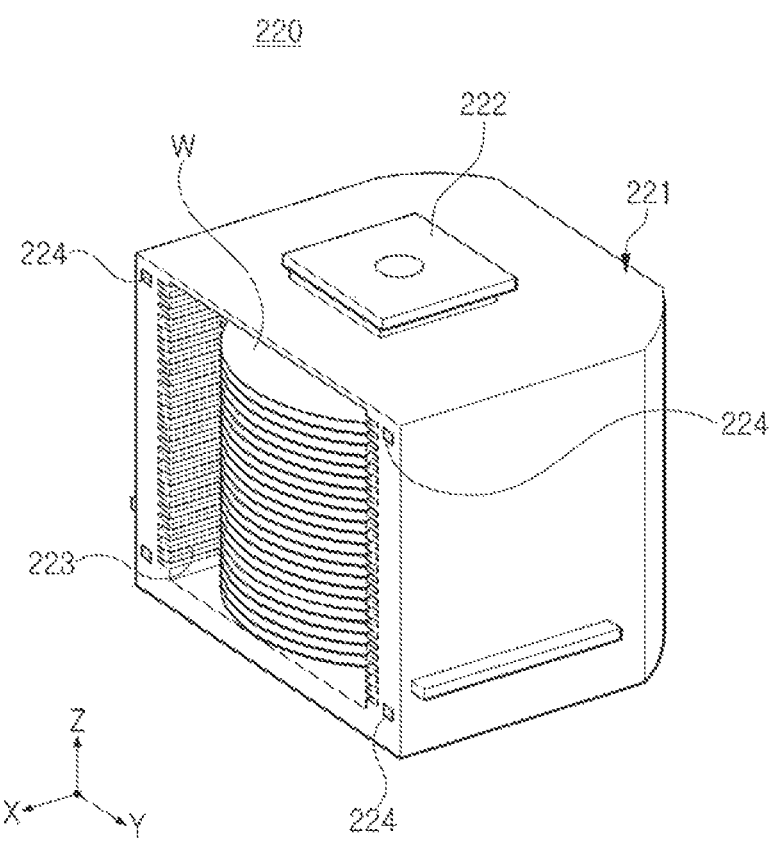
FIGS. 5, 6, 7 and 8 are diagrams illustrating transfer structures according to an example embodiment of the present disclosure.

FIG. 5 illustrates the FOUP 220 that transfers the wafer W to the wafer transfer apparatus 200 or receives the wafer W from the wafer transfer apparatus 200, as described with reference to FIG. 3. Referring to FIG. 5, an FOUP 220 may include a case 221, a fixing portion 222 fixed to a rail for moving the FOUP 220 to transfer a wafer W, a storage groove 223 in which the wafer W is stored, and a plurality of markers 224 attached to one surface of the case 221.

In the example embodiment illustrated in FIG. 5, the wafer W may be stacked in an internal space of the case 221 in the Z-axis direction, and an upper surface of the wafer W, parallel to the X-axis and Y-axis directions, may be accommodated in the case 221. In addition, the plurality of markers 224 may be attached to a front surface of the case 221 that may be opened to eject or feed the wafer W from or into the case 221. For example, the plurality of markers may be located on a plane, parallel to the Y-axis and Z-axis directions. A plane to which the plurality of markers is attached may be a plane, perpendicular to a transfer direction in which the wafer W is fed into and ejected from the FOUP 220 by a wafer transfer robot 210.

The plurality of markers 224 may be utilized for a teaching operation in which a controller of the wafer transfer apparatus 200 adjusts position information about the FOUP 220, and may be identified by a sensor unit 215 of the wafer transfer robot 210, as described with reference to FIG. 4. Assuming that the sensor unit 215 includes a camera sensor 216 and a laser sensor 217, the controller may recognize each of the plurality of markers 224 using an image generated by the camera sensor 216 and a distance to each of the plurality of markers 224 may be measured by the laser sensor 217. The controller may store shape information, dimension information, etc., of each of the plurality of markers 224 in advance, and with reference thereto, the operation of teaching adjusting the position information about the FOUP 220 may be completed. The number of the plurality of markers 224 attached to the FOUP 220 may be at least three such that the sensor unit 215 recognizes the plurality of markers 224 to generate the position information about the FOUP 220.

Figure 6:
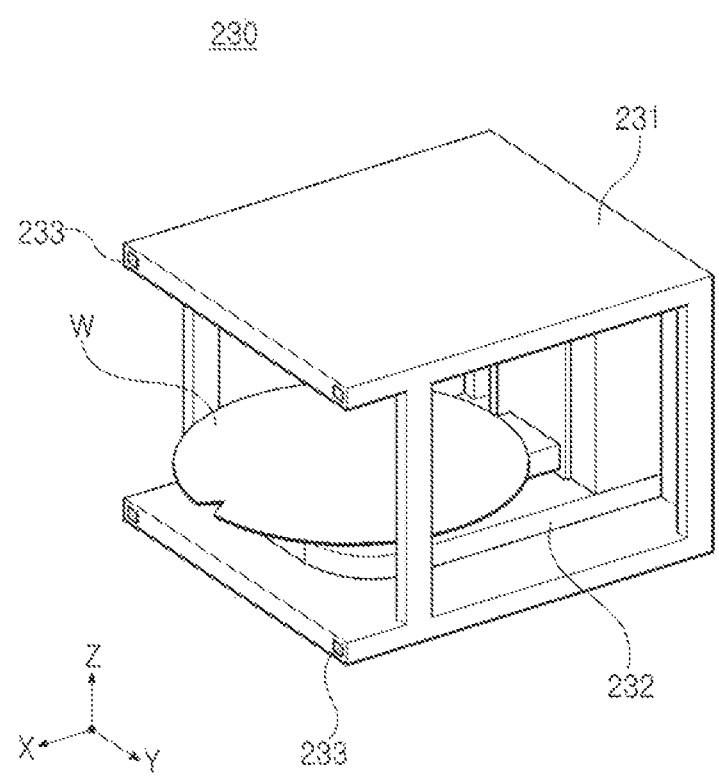

FIG. 6 illustrates the aligner 230 for aligning the wafers W in the wafer transfer apparatus 200 in a predetermined direction, as described with reference to FIG. 3 above. Referring to FIG. 6, an aligner 230 may include a case 231, an alignment unit 232 for adjusting a direction of a wafer W, and a plurality of markers 233 attached to one surface of the case 231.

Referring to FIG. 6, the wafer W may include a groove for determining a direction thereof. When the wafer W is fed into the aligner 230, the alignment unit 232 may rotate the wafer W, based on the Z-axis direction, such that the groove is located in a predetermined direction.

The plurality of markers 233 may be used for a teaching operation in which a controller of the wafer transfer apparatus 200 adjusts position information about the aligner 230, and may be identified by a sensor unit 215 of the wafer transfer robot 210, as described with reference to FIG. 4. For example, the plurality of markers 233 attached to the aligner 230 may have a shape different from shapes of the plurality of markers 224 attached to the FOUP 220 described above. The operation of teaching recognizing the plurality of markers 233 and adjusting the position information about the aligner 230 may be performed in a similar manner to the operation of teaching the FOUP 220.

Figure 7:
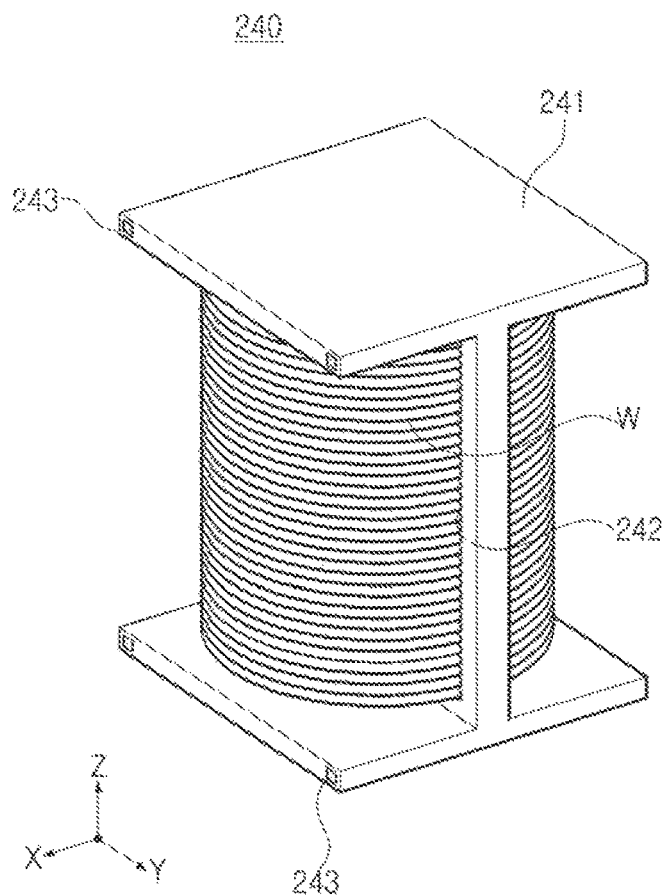

FIG. 7 illustrates the buffer 240 for temporarily storing the wafers W in the wafer transfer apparatus 200, as described with reference to FIG. 3 above. Referring to FIG. 7, a buffer 240 may include a case 241, a storage groove 242 for storing a wafer W, and a plurality of markers 243. The wafer W inserted into the storage groove 242 may be stacked in the Z-axis direction.

The plurality of markers 243 may be used for a teaching operation in which a controller of the wafer transfer apparatus 200 adjusts position information about the buffer 240, and may be identified by a sensor unit 215 of the wafer transfer robot 210, as described with reference to FIG. 4. The plurality of markers 243 attached to the buffer 240 may have a shape different from shapes of the plurality of markers 224 attached to the FOUP 220 and shapes of the plurality of markers 233 attached to the aligner 230. Therefore, the controller may use the sensor unit 215 to distinguish the buffer 240, the aligner 230, and the FOUP 220 from each other, and accurately adjust respective position information thereof. The operation of teaching recognizing the plurality of markers 243 and adjusting the position information about the buffer 240 may be performed in a similar manner to the operation of teaching the FOUP 220.

In the example embodiments described with reference to FIGS. 5 to 7, position information about each of the FOUP 220, the aligner 230, and the buffer 240 may be defined in a three-dimensional coordinate axis. For example, the controller of the wafer transfer apparatus 200 may define positions of the plurality of markers 224, 233, and 243 attached to each of the FOUP 220, the aligner 230, and the buffer 240 in three-dimensional coordinates. Therefore, the controller may accurately determine target coordinates at which a hand unit 211 of the wafer transfer robot 210 should be located to accurately eject and feed the wafer W for each of the FOUP 220, the aligner 230, and the buffer 240.

In addition, to feed the wafer W in a correct position for each of the FOUP 220, the aligner 230, and the buffer 240, and accurately hold and eject the accommodated wafer W, the controller may generate transfer distance information on which direction and how far the hand unit 211 of the wafer transfer robot 210 should move in target coordinates. For example, the transfer distance information may be determined according to a size of each of the FOUP 220, the aligner 230, and the buffer 240, a diameter of the wafer W, etc.

The controller of the wafer transfer apparatus 200 may control the wafer transfer robot 210 to perform an operation of moving the wafer W with reference to the target coordinates and the transfer distance information for the wafer transfer robot 210. In addition, efficiency of the semiconductor process may be improved by automatically executing the teaching operation as described above at a point in time at which an operation of the wafer transfer apparatus 200 starts and/or a point in time at which a predetermined period arrives.

Figure 8:
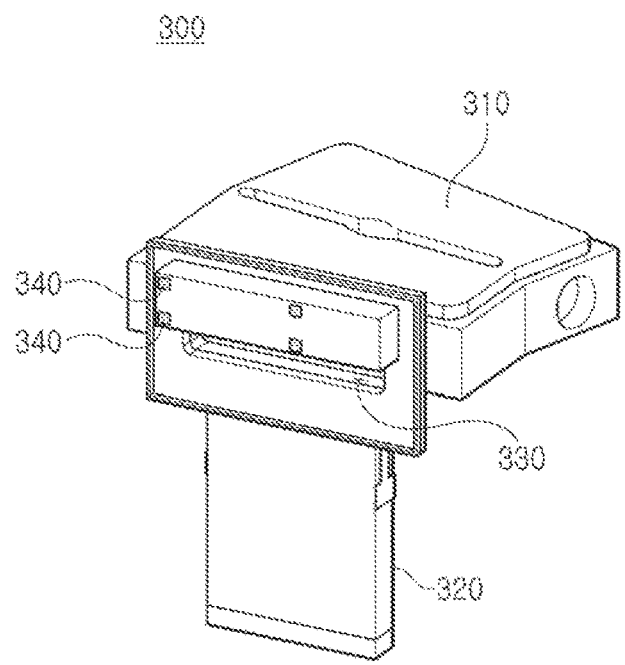

The wafer transfer robot 210 may transfer the wafer to the load-lock chamber, in addition to the FOUP 220, the aligner 230, and the buffer 240, as described above with reference to FIG. 1. FIG. 8 illustrates a load-lock chamber 300 receiving a wafer from a wafer transfer robot 210 or transfers the wafer to the wafer transfer robot 210 according to an example embodiment of the present disclosure. Referring to FIG. 8, the load-lock chamber 300 may include a housing 310, a door 320, a wafer entrance/exit 330, and a plurality of chamber markers 340.

The load-lock chamber 300 may receive the wafer held by the wafer transfer robot 210, and may transfer the same to processing chambers. In this case, the wafer may be transferred to the processing chamber in a state in which an internal space of the load-lock chamber 300 may be decompressed such that foreign substances do not flow into a processing chamber. For example, when the wafer is inserted into the wafer entrance/exit 330, the door 320 may rise to adjust an internal air pressure of the load-lock chamber 300 in a state in which the wafer entrance/exit 330 is blocked, and then the wafer may be transferred toward the processing chamber.

As described above with reference to FIGS. 5 to 7, the controller of the wafer transfer apparatus may identify the plurality of chamber markers 340 attached to the load-lock chamber 300, to acquire position information about the load-lock chamber 300 (e.g., a position of the wafer entrance/exit 330 provided in the load-lock chamber 300). To this end, the plurality of chamber markers 340 may be attached to be adjacent to the wafer entrance/exit 330, as illustrated in FIG. 8. The controller of the wafer transfer apparatus may automatically execute a teaching operation for determining the position information about the FOUP 220, the aligner 230, and the buffer 240 for the load-lock chamber 300, and thus the wafer transfer robot 210 may accurately exchange the wafer with the load-lock chamber 300 without error.

Figure 9:
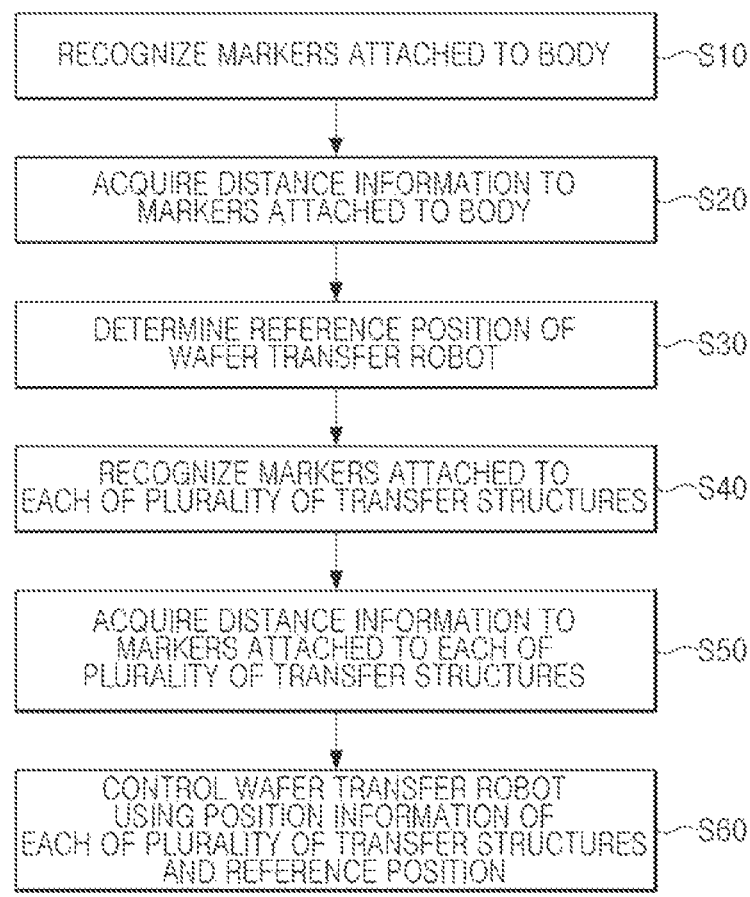
FIG. 9 is a flowchart illustrating an operation of a wafer transfer apparatus according to an example embodiment of the present disclosure.

FIG. 9 is a flowchart illustrating an operation of a wafer transfer apparatus according to an example embodiment of the present disclosure.

Referring to FIG. 9, an operation of a wafer transfer apparatus according to an example embodiment of the present disclosure is described. In operation S10, a controller of the wafer transfer apparatus may recognize markers attached to a body. The body may be a main frame to which a wafer transfer robot, an aligner, a buffer, etc. included in the wafer transfer apparatus are mounted, and to which a FOUP transferred by a transfer device such as a rail externally is connected. The markers attached to the body may be recognized by a camera sensor, a two-dimensional code reader, etc., included in a sensor unit mounted on the wafer transfer robot.

The controller may adjust a position and/or an attitude of the wafer transfer robot such that the sensor unit accurately recognize the markers attached to the body. In an example embodiment, when the markers attached to the body include a two-dimensional code or a specific shape, and the camera sensor is mounted on the wafer transfer robot, a position and/or an attitude of the wafer transfer robot may be adjusted such that a marker is located at an exact center of an image, captured by the camera sensor, in the image.

In operation S20, the wafer transfer robot is adjusted to have a position and/or an attitude, capable of accurately recognizing one of the markers of the body, the controller may acquire distance information to the corresponding marker. For example, the controller may emit a laser to a marker using a laser sensor mounted on the wafer transfer robot, to acquire distance information to the marker.

The controller may acquire position information about each of the markers attached to the body by repeating operations S10 and S20 as many as the number of markers attached to the body. In an example embodiment, the position information about each of the markers attached to the body may be generated in three-dimensional coordinates, and in operation S30, the controller may determine a reference position of the wafer transfer robot using this information. The reference position determined in operation S30 may be an origin coordinate for determining a relative position of the wafer transfer robot with respect to the body of the wafer transfer apparatus.

In operation S40, when the reference position is determined, the controller may move the wafer transfer robot to recognize markers respectively attached to a plurality of transfer structures disposed in the wafer transfer apparatus. For example, the controller may select a transfer structure from the plurality of transfer structures, and may adjust the wafer transfer robot to a position and an attitude, capable of accurately recognizing one of the plurality of markers attached to the selected transfer structure. As described above, the position and the attitude of the wafer transfer robot may be adjusted such that the marker may be located at the exact center of the image captured by the camera sensor mounted on the wafer transfer robot.

In operation S50, the controller may acquire information about a distance to a marker attached to each of the plurality of transfer structures, and recognized by the camera sensor.

The distance information may be generated by using a laser sensor attached to the wafer transfer robot, together with the camera sensor. The controller may acquire position information including position and/or attitude information about the wafer transfer robot with respect to the selected transfer structure by repeatedly performing operations S40 and S50 for each of the plurality of markers attached to the selected transfer structure. In addition, the controller may repeatedly perform operations S40 and S50 for each of the plurality of transfer structures, to acquire position information for each of the plurality of transfer structures.

When the position information about each of the plurality of transfer structures is secured, the controller may end a teaching operation. Thereafter, a semiconductor process may be performed while wafers are fed and ejected by the wafer transfer apparatus. While the semiconductor process is in progress, in operation S60, the controller of the wafer transfer apparatus may control the wafer transfer robot using the position information about each of the plurality of transfer structures and the reference position determined in operation S30. For example, the controller may use the reference position as an offset coordinate, and may control the wafer transfer robot by subtracting the reference position from coordinates indicating the position information about each of the plurality of transfer structures.

According to an example embodiment, a verification operation for a teaching operation in a semiconductor process may be performed using the position information about each of the plurality of transfer structures and the reference position. The verification operation may include an operation of actually transferring a dummy wafer while controlling the position and/or the attitude of the wafer transfer robot using the position information and the reference positions of each of the plurality of transfer structures. For example, after actually transferring the dummy wafer between the FOUP, the aligner, the buffer, etc., whether damage has occurred in the dummy wafer may be checked to confirm whether the position information and the reference position of each of the plurality of transfer structures are accurately generated.

FIGS. 10, 11, 12 and 13 are diagrams illustrating an operation of a wafer transfer apparatus according to an example embodiment of the present disclosure.

FIGS. 10 to 13 are enlarged views of a partial region of a wafer transfer apparatus 400 according to an example embodiment of the present disclosure. First, referring to FIG. 10, a wafer transfer apparatus 400 may include a wafer transfer robot 410, an aligner 430, and a buffer 440. The wafer transfer robot 410 may be mounted on a robot frame 401 to move in the vertical Z-axis direction.

The wafer transfer robot 410 may include a hand unit 411 holding a wafer, a driving unit (e.g., 412 to 414), and a sensor unit 415. The hand unit 411 and the driving unit (e.g., 412 to 414) may be rotationally moved, respectively, based on a rotation axis, parallel to the Z-axis direction at a joint therebetween. The hand unit 411 may move in the X-axis and Y-axis directions by rotational movement at each joint, and the wafer may be transferred between the aligner 430 and the buffer 440. The sensor unit 415 may be attached to one of the driving unit (e.g., 412 to 414), and may include, for example, a camera sensor 416 capable of capturing an image, a laser sensor 417 capable of measuring a distance to a specific object by emitting laser light.

Transport structures such as the aligner 430, and the buffer 440, may be mounted on a body 405. A plurality of reference markers 403 may be attached to the body 405. A teaching operation for adjusting position information about the wafer transfer robot 410, the aligner 430, and the buffer 440 may be periodically executed whenever a predetermined time elapses during an initial operation of the wafer transfer apparatus 400 or during an operation of the wafer transfer apparatus 400. For example, the teaching operation may be automatically executed by a controller mounted in an internal space of the body 405 without using a separate teaching station.

Figure 10:
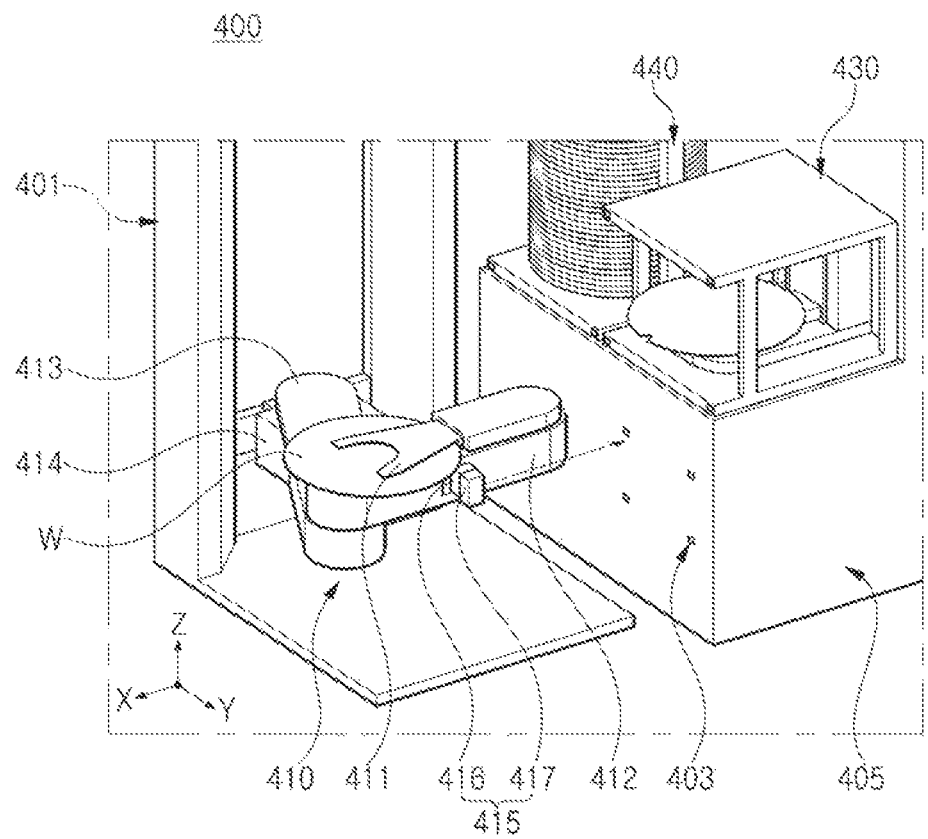
FIGS. 10, 11, 12 and 13 are diagrams illustrating an operation of a wafer transfer apparatus according to an example embodiment of the present disclosure.
Figure 11:
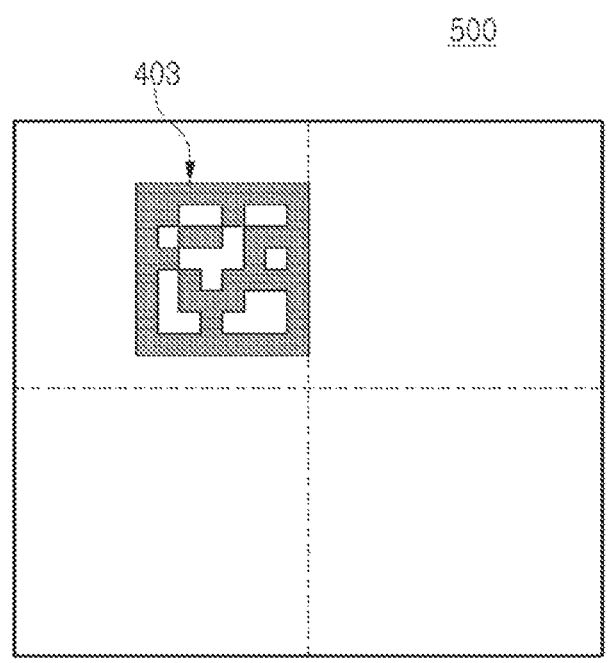

In the teaching operation, the controller may acquire coordinate information about each of the plurality of reference markers 403 attached to the body 405 using the sensor unit 415, and, may start with determining a reference position of the wafer transfer robot 410 attached to the body 405. As illustrated in FIGS. 10 and 11, the controller may capture a marker, among the plurality of reference markers 403, as an image 500, by using the camera sensor 416 mounted on the sensor unit 415. As illustrated in FIG. 11, the reference marker 403 may not be displayed in a center area of the image 500, depending on a position and an attitude of the wafer transfer robot 410.

Figure 12:
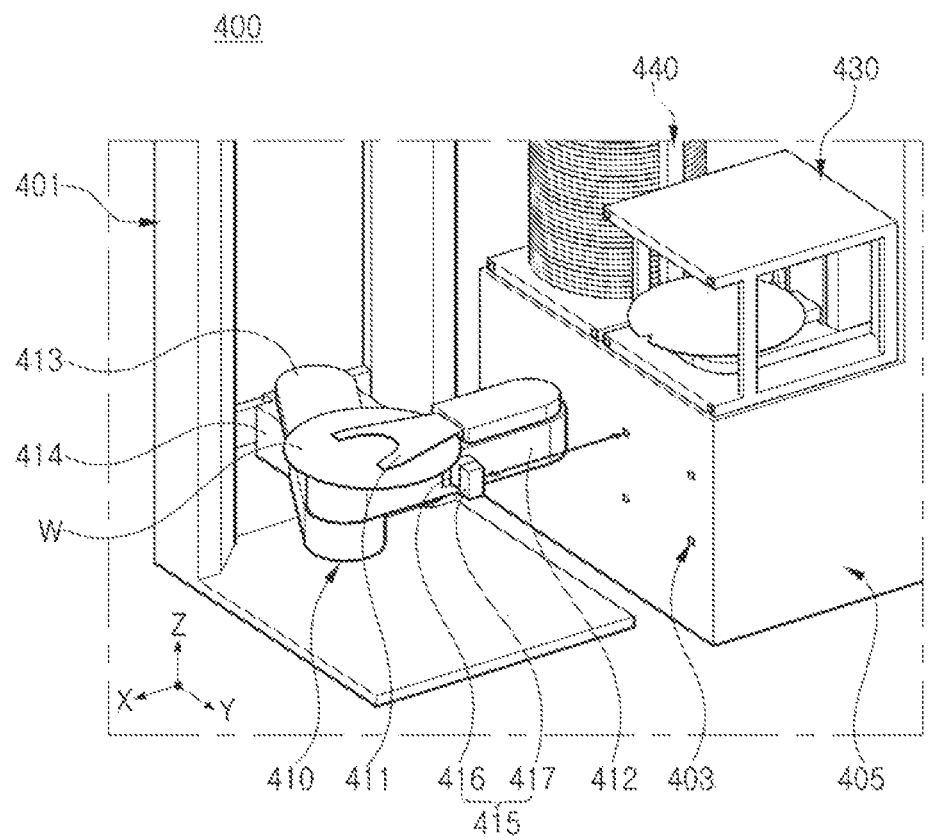

When the reference marker 403 is not displayed in the center area of the image 500, the controller may re-capture the reference marker 403 while moving the wafer transfer robot 410, as illustrated in FIG. 12. When the reference marker 403 is located in a center of an image 510 captured after moving the wafer transfer robot 410, the controller may use the image 510 to generate first coordinate information about the reference marker 403 in the Z-axis direction and second coordinate information about the reference marker 403 in the Y-axis direction.

Figure 13:
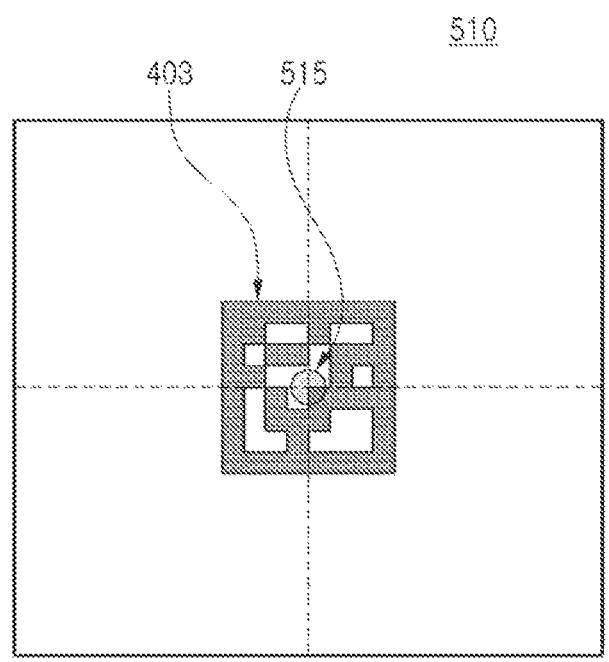

When the reference marker 403 is displayed in the center area of the image 510, the controller may fix the position and the attitude of the wafer transfer robot 410, and may then use the laser sensor 417 to emit laser light 515 to the reference marker 403. Referring to FIG. 13, the laser light 515 emitted from the laser sensor 417 may be emitted to the center of the reference marker 403, may be reflected, and may be detected again by the laser sensor 417. Therefore, the controller may acquire distance information from the sensor unit 415 to the reference marker 403 using information measured by the laser sensor 417 reflecting the laser light. The distance information in a 3D space may correspond to third coordinate information about the reference marker 403 in the X-axis direction.

As such, the controller may acquire coordinate information indicating the positions of each of the plurality of reference markers 403 in the three-dimensional space using the camera sensor 416 and the laser sensor 417. In an example embodiment, the controller may generate a three-dimensional (3D) transformation matrix using the coordinate information acquired for each of the plurality of reference markers 403, and may determine a reference position of the wafer transfer robot 410 based thereon.

When the reference position is determined, the controller may recognize the markers attached to each of the transfer structures, to acquire position information about each of the transfer structures for moving the wafer between the transfer structures. Hereinafter, it will be described with reference to FIGS. 14 to 17.

FIGS. 14, 15, 16 and 17 are diagrams illustrating an operation of a wafer transfer apparatus according to an example embodiment of the present disclosure.

Figure 14:
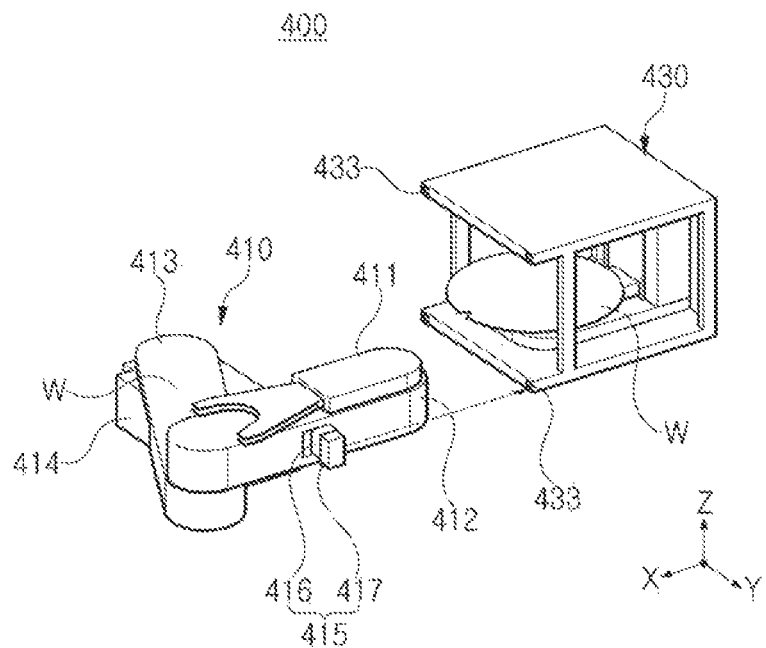
FIGS. 14, 15, 16 and 17 are diagrams illustrating an operation of a wafer transfer apparatus according to an example embodiment of the present disclosure.

Referring to FIG. 14, a controller may move a wafer transfer robot 410 to obtain coordinate information for a plurality of markers 433 attached to an aligner 430. First, the controller may adjust a position and an attitude of the wafer transfer robot 410 until one of the plurality of markers 433 is displayed in an image output by a camera sensor 416. In an example embodiment, shapes of the plurality of markers 433 attached to the aligner 430 may be different from a shape of a reference marker 403.

Figure 15:
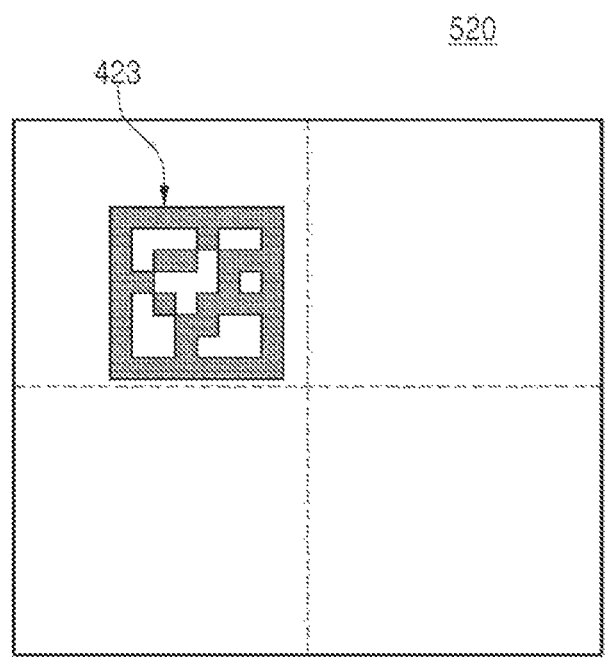
Figure 16:
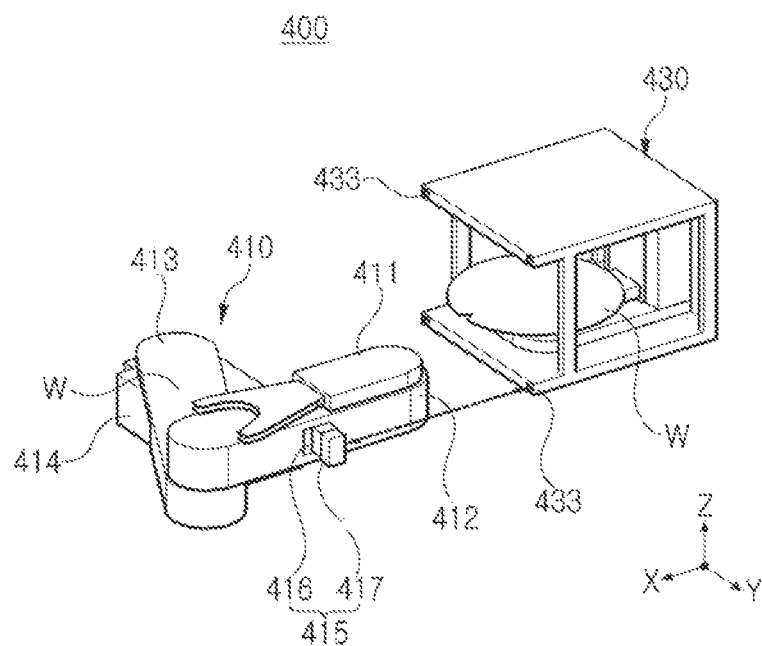

Referring to FIG. 15, a marker 433 may be displayed on an image 520 output by a camera sensor 416. When the marker 433 is not displayed at a center area of the image 520, a controller may re-adjust a position and an attitude of a wafer transfer robot 410. As illustrated in FIG. 16, when a position and an attitude of a wafer transfer robot 410 are adjusted again, a controller may use a camera sensor 416 to re-capture an image 530 including a marker 433.

Figure 17:
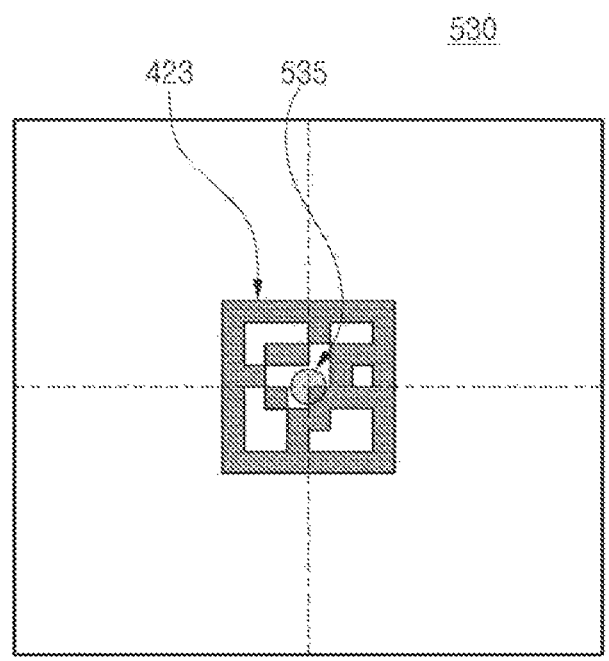

As illustrated in FIG. 17, when a position and an attitude of a wafer transfer robot 410 are corrected such that a marker 433 is displayed at a center area of an image 530 output by a camera sensor 416, a controller may emit laser light 535 to a central portion of the marker 433 using a laser sensor 417. The laser light 535 emitted to the central portion of the marker 433 may be reflected, and may be incident back to the laser sensor 417. The controller may use a period in time taken until the laser light 535 is reflected from the marker 433 and returns, to measure a distance to the marker 433.

Similarly to that described above with reference to FIGS. 10 to 13, the controller may refer to a position of the marker 433 displayed on the image 530, to acquire first coordinate information in the Z-axis direction and second coordinate information in the Y-axis direction. Also, the controller may acquire third coordinate information in the X-axis direction based on a distance to the marker 433. The controller may generate a 3D transformation matrix using the coordinate information obtained for each of the plurality of markers 433 attached to the aligner 430, and may determine position information about the wafer transfer robot 410 for feeding/ejecting the wafer into/from the aligner 430 based thereon.

Figure 18:
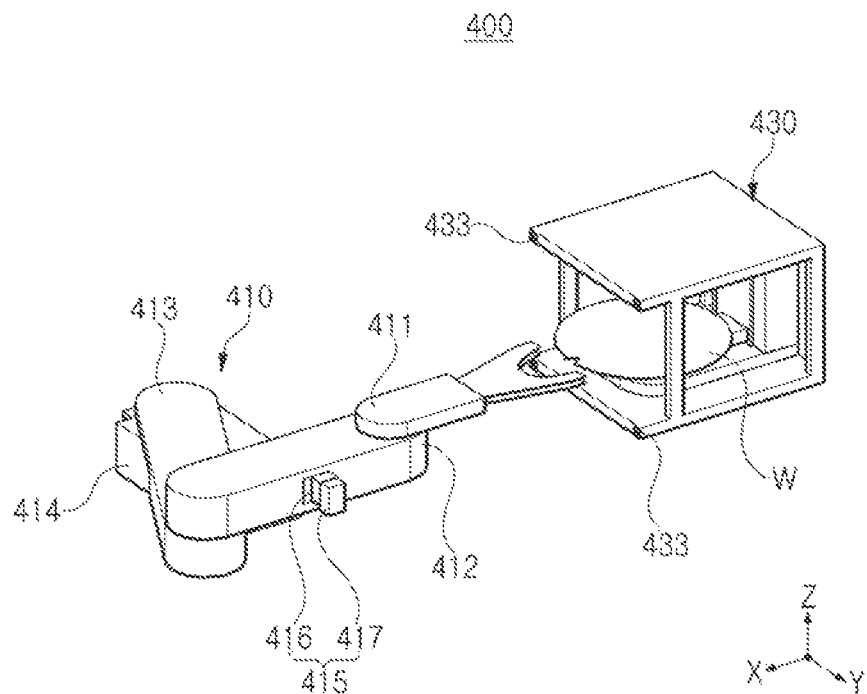
FIGS. 18 and 19 are diagrams illustrating an operation of a wafer transfer apparatus according to an example embodiment of the present disclosure.
Figure 19:
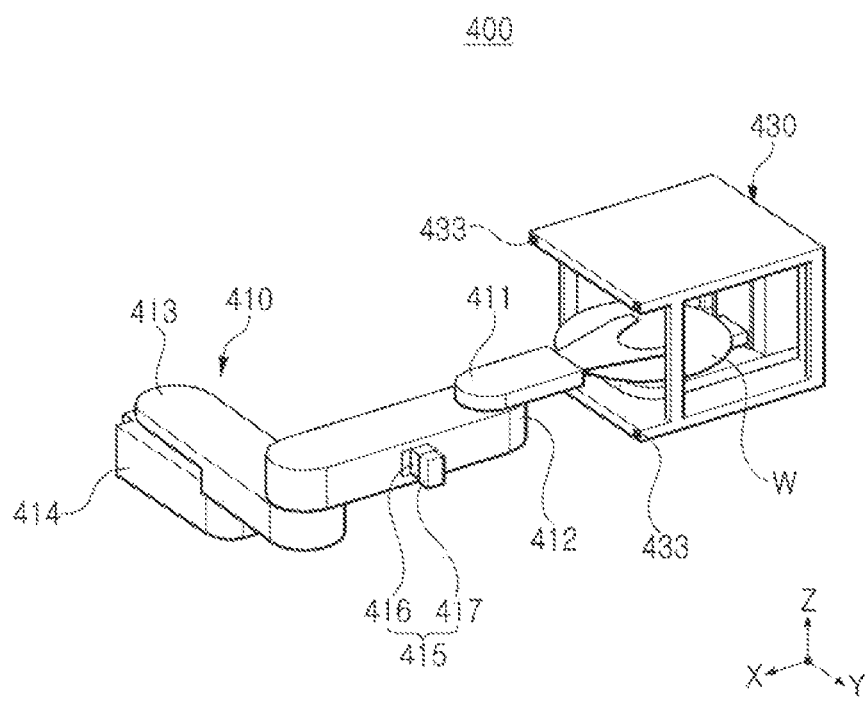

FIGS. 18 and 19 are diagrams illustrating an operation of a wafer transfer apparatus according to an example embodiment of the present disclosure.

In an operation of a wafer transfer apparatus 400 described with reference to FIGS. 18 and 19, a wafer transfer robot 410 may eject a wafer W from an aligner 430. As described above, a controller of the wafer transfer apparatus 400 may acquire coordinate information about a plurality of markers 433 attached to the aligner 430 in an teaching operation, and may generate position information about the wafer transfer robot 410 for ejecting the wafer from the aligner 430 based thereon.

Referring to FIG. 18, the controller may position the wafer transfer robot 410 on a front surface of the aligner 430, based on the position information about the wafer transfer robot 410 generated in the teaching operation. Thereafter, as illustrated in FIG. 19, a hand unit 411 of the wafer transfer robot 410 may move in the X-axis direction, which may be a transfer direction, to hold the wafer W stored in the aligner 430.

A distance at which the controller moves the hand unit 411 to hold the wafer W may be determined according to dimension information about the aligner 430. For example, using the dimension information about the aligner 430 and the position information about the wafer transfer robot 410 with respect to the aligner 430 determined in the teaching operation, the controller may move the hand unit 411 and may hold the wafer W. The dimension information about the aligner 430 may include distance information from a plane to which the plurality of markers 433 are attached to a center of the wafer W accommodated in the aligner 430.

The controller may determine position information about the wafer transfer robot 410 with respect to the aligner 430 in the previously completed teaching operation. The controller may move the hand unit 411 of the wafer transfer robot 410 by a transfer distance, which may be a distance between a plane to which the plurality of markers 433 are attached and a center position of the wafer W stored in the aligner 430, in a direction in which the wafer W should be transferred, to eject the wafer W stored in the aligner 430 or feed the wafer W into the aligner 430.

According to an example embodiment of the present disclosure, position information about transfer structures including a FOUP, an aligner, and a load-lock chamber, may be acquired by a sensor unit attached to a wafer transfer robot, and the wafer transfer robot may be controlled, based on the position information, to transfer the wafer. Therefore, since an operation of teaching updating the position information about the transfer structures may be automatically completed without intervention of an operator, a wafer transfer apparatus may be operated regardless of skill of the operator, accuracy of transfer of the wafer may be improved, and efficiency of a semiconductor process may be improved. In addition, since it is possible to be implemented with only the sensor unit attached to the wafer transfer robot and markers attached to the transfer structures without a separate teaching station, the operation of teaching the wafer transfer apparatus may be automated without significantly increasing costs thereof. Unlike the related art, since there is no restriction on a shape of the transfer structure, and the operator does not require a series of manual tasks such as setting the wafer or teaching jig in a correct position of the transfer structure, the operation of teaching the wafer transfer apparatus may be fully automated.

Thus far, various example embodiments have been described and illustrated in terms of blocks, as shown in the drawings, which carry out a described function or functions. These blocks, which may be referred to herein as units, modules or the like, may be physically implemented by analog and/or digital circuits such as logic gates, integrated circuits, microprocessors, microcontrollers, memory circuits, passive electronic components, active electronic components, optical components, hardwired circuits, or the like, and may be driven by firmware and software. The circuits may, for example, be embodied in one or more semiconductor chips, or on substrate supports such as printed circuit boards and the like. Circuits included in a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks. Likewise, the blocks of the embodiments may be physically combined into more complex blocks.

Various advantages and effects of the present disclosure may not be limited to the above, and will be more easily understood in the process of describing specific embodiments of the present disclosure.

Each of the embodiments provided in the above description is not excluded from being associated with one or more features of another example or another embodiment also provided herein or not provided herein but consistent with the disclosure.

While example embodiments have been illustrated and described above, it will be apparent to those skilled in the art that modifications and variations could be made without departing from the scope of the present disclosure as defined by the appended claims.

What is claimed is:

1. A wafer transfer apparatus comprising:
a controller;
a wafer transfer robot comprising:
a hand unit configured to hold a wafer,
a driving unit connected to the hand unit and configured to move the wafer, the driving unit comprising a link arm unit and a base unit connected to the link arm unit, and
a sensor unit provided on the driving unit; and
a plurality of transfer structures configured to exchange the wafer with the wafer transfer robot, each of the plurality of transfer structures comprising a plurality of markers recognizable by the sensor unit,
wherein the sensor unit comprises:
a camera sensor recognizing the plurality of markers, and
a laser sensor configured to measure distances to the plurality of markers by emitting a laser to the plurality of markers and receiving the laser reflected from the plurality of markers, and
wherein the controller is configured to:
acquire position information about the plurality of transfer structures with respect to the wafer transfer robot, based on positions of the plurality of markers recognized by the sensor unit and the distances to the plurality of markers measured by the sensor unit, and
control the wafer transfer robot based on the position information, and
wherein the base unit is configured to move in a direction in which a wafer is stacked in at least one transfer structure of the plurality of transfer structures.

2. The wafer transfer apparatus of claim 1, wherein the plurality of markers comprises three or more markers.

3. The wafer transfer apparatus of claim 2, wherein the controller is further configured to:
sequentially measure distances to a number of markers of the plurality of markers that are attached to a target transfer structure, and
determine position information about the target transfer structure, based on the distances to the number of markers of the plurality of markers.

4. The wafer transfer apparatus of claim 3, wherein the controller is further configured to:
locate one marker of the plurality of markers in a central area of a marker image obtained by the camera sensor capturing the one marker by adjusting a position of the wafer transfer robot, and
emit a laser to a central portion of the one marker by the laser sensor.

5. The wafer transfer apparatus of claim 1, wherein each of the plurality of markers is located on one plane in a three-dimensional space inside of the wafer transfer apparatus.

6. The wafer transfer apparatus of claim 1, wherein the plurality of transfer structures comprise at least a portion of a front opening unified pod (FOUP), an aligner, and a buffer, and
wherein the plurality of markers are located on a plane, perpendicular to a transfer direction in which the wafer is fed and ejected in each of the plurality of transfer structures by the wafer transfer robot.

7. The wafer transfer apparatus of claim 6, wherein the controller is further configured to, for each of the plurality of transfer structures:
control the wafer transfer robot based on position information about the plane in which the plurality of markers are located, and a transfer distance that the wafer is configured to move in a transfer direction.

8. The wafer transfer apparatus of claim 7, wherein the transfer distance is a distance between a center position of the wafer and the plane in which the plurality of markers are located in the transfer direction.

9. The wafer transfer apparatus of claim 1, wherein the each of the plurality of markers comprises at least one of a QR code and an ArUco marker.

10. The wafer transfer apparatus of claim 1, further comprising:
a body on which the plurality of transfer structures are provided,
wherein the controller is provided in the body.

11. The wafer transfer apparatus of claim 10, wherein a plurality of reference markers are provided the body, and
wherein the controller is further configured to determine a reference position of the wafer transfer robot by:
recognizing, with the sensor unit, positions of the plurality of reference markers, and
measuring distances to the plurality of reference markers.

12. A wafer transfer apparatus comprising:
a body on which an front opening unified pod (FOUP) with a wafer is provided;
a first wafer transfer robot configured to transfer the wafer; and
an aligner provided on the body and in which the wafer to be inserted into a load-lock chamber is accommodated;
wherein the wafer transfer apparatus is configured to:
obtain, with a first sensor unit provided on the first wafer transfer robot, position information about the body, the FOUP, the aligner, and a wafer inlet of the load-lock chamber by recognizing a plurality of markers provided on the body, the FOUP, the aligner, and the wafer inlet, and
transfer the wafer based on the position information.

13. The wafer transfer apparatus of claim 12, wherein the wafer transfer apparatus comprises an equipment front end module (EFEM).

14. The wafer transfer apparatus of claim 12, wherein a number of the plurality of markers is three or more, and
wherein the wafer transfer apparatus is further configured to:
generate, with the first sensor unit, coordinate information for each of the plurality of markers and distance information for each of the plurality of markers, and
acquire the position information based on the coordinate information and the distance information.

15. The wafer transfer apparatus of claim 14, wherein the first sensor unit comprises:
a camera sensor configured to generate the coordinate information, and
a laser sensor configured to generate the distance information.

16. The wafer transfer apparatus of claim 14, wherein the first wafer transfer robot further comprises:
a hand unit configured to hold the wafer, and
a driving unit connected to the hand unit,
wherein the driving unit comprises:
a first driving unit connected to the hand unit, and
a second driving unit connected to the hand unit through the first driving unit, and
wherein the first sensor unit is provided on the first driving unit.

17. The wafer transfer apparatus of claim 12, further comprising:

a buffer in which the wafer transferred through the load-lock chamber is disposed for a predetermined waiting time after a semiconductor process performed by a processing chamber receiving the wafer from the load-lock chamber is completed.

18. The wafer transfer apparatus of claim 17, further comprising:
a second wafer transfer robot configured to transfer the wafer between the processing chamber and the load-lock chamber, and
wherein the second wafer transfer robot comprises a second sensor unit configured to recognize chamber markers provided on each of the wafer inlet of the load-lock chamber and a wafer inlet of the processing chamber.

19. A wafer transfer apparatus comprising:
a plurality of transfer structures comprising a plurality of first markers and configured to provide a space in which a wafer is stored;
a body on which the plurality of transfer structures are provided, the body comprising a plurality of reference markers different from the plurality of first markers;
a wafer transfer robot configured to transfer the wafer between the plurality of transfer structures, the wafer transfer robot comprising a hand unit configured to hold a wafer, a driving unit connected to the hand unit and configured to move the wafer, and a sensor unit comprising a camera sensor configured to recognize the plurality of first markers and the plurality of reference markers; and
a controller provided in the body and configured to execute a teaching operation of the wafer transfer robot,
wherein, in the teaching operation, the controller is configured to:
determine, with the camera sensor of the sensor unit, a reference position and a relative position of the wafer transfer robot with respect to the body by acquiring coordinate information for each of the plurality of reference markers, and
determine, with the camera sensor of the sensor unit, position information comprising a position and an attitude of the wafer transfer robot for each of the plurality of transfer structures by acquiring coordinate information for each of the plurality of first markers.

* * * * *